United States Patent
Jones et al.

(10) Patent No.: US 9,818,669 B2
(45) Date of Patent: Nov. 14, 2017

(54) PRINTED CIRCUIT BOARD ASSEMBLY INCLUDING CONDUCTIVE HEAT TRANSFER

(71) Applicant: Honeywell International Inc., Morristown, NJ (US)

(72) Inventors: Kirk Jones, Glendale, AZ (US); Thom Kreider, Peoria, AZ (US); Larry Jackson, Glendale, AZ (US)

(73) Assignee: Honeywell International Inc., Morris Plains, NJ (US)

(*) Notice: Subject to any disclaimer, the term of this patent is extended or adjusted under 35 U.S.C. 154(b) by 398 days.

(21) Appl. No.: 14/453,333

(22) Filed: Aug. 6, 2014

(65) Prior Publication Data

US 2016/0043017 A1    Feb. 11, 2016

(51) Int. Cl.

| | |
|---|---|
| *H01L 23/373* | (2006.01) |
| *H05K 7/12* | (2006.01) |
| *H05K 7/20* | (2006.01) |
| *H01L 21/50* | (2006.01) |
| *H01L 23/498* | (2006.01) |
| *H05K 7/14* | (2006.01) |
| *H01L 23/367* | (2006.01) |

(Continued)

(52) U.S. Cl.
CPC .......... *H01L 23/3736* (2013.01); *H01L 21/50* (2013.01); *H01L 23/3675* (2013.01); *H01L 23/4006* (2013.01); *H01L 23/498* (2013.01); *H05K 7/1053* (2013.01); *H05K 7/12* (2013.01); *H05K 7/1427* (2013.01); *H05K 7/20445* (2013.01); *H05K 7/20509* (2013.01); *H05K 7/20545* (2013.01); *H01L 23/10* (2013.01); *H01L 23/3731* (2013.01); *H01L 2023/4037* (2013.01); *H01L 2924/0002* (2013.01); *H05K 2201/10719* (2013.01); *H05K 2201/10734* (2013.01)

(58) Field of Classification Search
CPC . H01L 2924/15311; H01L 2224/49109; H01L 2224/16225; H01L 2924/351; H01L 2924/14; H01L 2224/48624
USPC .......................................... 257/99
See application file for complete search history.

(56) References Cited

U.S. PATENT DOCUMENTS

| | | | |
|---|---|---|---|
| 5,802,707 A | * | 9/1998 | Brownell ............ H01L 23/3737 257/713 |
| 5,898,219 A | | 4/1999 | Barrow |

(Continued)

OTHER PUBLICATIONS

Response to the Extended Search Report dated Dec. 18, 2015, from counterpart European Application No. 15178741.3 filed Jul. 18, 2016, 15 pp.

(Continued)

*Primary Examiner* — Nathan W Ha
(74) *Attorney, Agent, or Firm* — Shumaker & Sieffert, P.A.

(57) ABSTRACT

A printed circuit board assembly (PCBA) may include a printed circuit board (PCB), a socket mechanically and electrically coupled to the PCB, and an integrated circuit package electrically coupled to the socket. The PCBA also may include a thermal cover comprising a thermally conductive material and a thermal strap thermally coupled to the thermal cover. The thermal cover may be thermally coupled to the integrated circuit package and mechanically urge the integrated circuit package in contact with the socket, and the thermal strap may include a thermally conductive material.

12 Claims, 4 Drawing Sheets

(51) Int. Cl.
  *H01L 23/40* (2006.01)
  *H05K 7/10* (2006.01)
  *H01L 23/10* (2006.01)

(56) References Cited

U.S. PATENT DOCUMENTS

| | | |
|---|---|---|
| 6,449,155 B1 | 9/2002 | Colbert et al. |
| 6,490,161 B1 | 12/2002 | Johnson |
| 6,504,243 B1 | 1/2003 | Andric et al. |
| 6,716,676 B2 | 4/2004 | Chen et al. |
| 7,053,295 B2 | 5/2006 | Murasawa |
| 7,134,881 B1 | 11/2006 | Sakairi |
| 7,251,138 B2 | 7/2007 | Hornung et al. |
| 7,269,015 B2 | 9/2007 | Hornung et al. |
| 7,304,381 B2 | 12/2007 | Rumer et al. |
| 7,428,154 B2 * | 9/2008 | Ishimine ............ H01L 23/4006 165/185 |
| 7,957,148 B1 * | 6/2011 | Gallarelli ............ H01L 23/32 165/80.3 |
| 7,980,861 B2 * | 7/2011 | Tamura ............ H05K 7/1069 439/247 |
| 8,008,133 B2 | 8/2011 | Tosaya et al. |
| 8,345,431 B2 | 1/2013 | Clayton et al. |
| 8,493,738 B2 | 7/2013 | Chainer et al. |
| 8,537,552 B2 | 9/2013 | Paquette et al. |
| 2004/0257786 A1 * | 12/2004 | Murasawa ......... H01L 23/4006 361/810 |
| 2005/0068740 A1 * | 3/2005 | Ulen .................. H01L 23/4006 361/719 |
| 2006/0268525 A1 | 11/2006 | Jeong |
| 2007/0236888 A1 * | 10/2007 | Eckberg ............. H01L 23/4006 361/704 |
| 2009/0093142 A1 * | 4/2009 | Lin ........................ H01L 23/32 439/66 |
| 2009/0096086 A1 * | 4/2009 | Natarajan ............. H01L 23/367 257/714 |
| 2009/0283902 A1 * | 11/2009 | Bezama ............. H01L 23/3675 257/713 |
| 2010/0321890 A1 | 12/2010 | Streyel et al. |
| 2012/0307471 A1 * | 12/2012 | Juarez ................. H05K 7/1418 361/796 |
| 2013/0147028 A1 | 6/2013 | Su et al. |
| 2013/0148305 A1 * | 6/2013 | Ankireddi ............ H01L 23/367 361/718 |

OTHER PUBLICATIONS

Extended Search Report from counterpart European Application No. 15178741.3, dated Dec. 18, 2015, 8 pp.
Communication pursuant to Article 94(3) EPC from counterpart European Application No. 15178741.3, dated Apr. 4, 2017, 5 pp.
Response to EPC Communication from counterpart European Application No. EP 15178741.3, filed on Aug. 22, 2017, 6 pp.

\* cited by examiner

PRINTED CIRCUIT BOARD ASSEMBLY INCLUDING CONDUCTIVE HEAT TRANSFER

TECHNICAL FIELD

The disclosure relates to printed circuit board assemblies.

BACKGROUND

Integrated circuits produce heat during operation; it may be desirable to transfer the heat away from the integrated circuits to maintain operating conditions of the integrated circuits. In many applications, heat is removed from integrated circuits using a heat spreader, heat sink, and convection-based cooling. For example, a fan may blow air across the heat sink to remove heat from the heat sink, and thus the integrated circuit.

SUMMARY

The disclosure describes a printed circuit board assembly (PCBA) including a thermal management mechanism for removing heat from an integrated circuit (IC) package using thermal conduction. The conduction of heat from the IC package may be accomplished using a thermal cover and a thermal strap. The thermal cover may be thermally coupled to the IC package and may mechanically urge the IC package into electrical contact with a socket. The thermal cover and thermal strap may provide a thermal pathway by which heat may be removed from the IC package. The thermal strap also may be made of relatively compliant material, such as copper, a copper alloy, or a thermally conductive composite material, which may facilitate relaxed manufacturing tolerances and relative movement between a printed circuit board (PCB) of the PCBA and the IC under thermal cycling.

In some examples, the disclosure describes a PCBA that includes a PCB, a socket mechanically and electrically coupled to the PCB, and an integrated circuit package electrically coupled to the socket. The PCBA also may include a thermal cover comprising a thermally conductive material and a thermal strap thermally coupled to the thermal cover. The thermal cover may be thermally coupled to the integrated circuit package and may mechanically urge the integrated circuit package in contact with the socket. The thermal strap may include a thermally conductive material.

In some examples, the disclosure describes a system including a chassis, a master interconnect board mechanically coupled to the chassis, and a PCBA electrically coupled to the master interconnect board. The PCBA may include a PCB, a socket mechanically and electrically coupled to the PCB, and an integrated circuit package electrically coupled to the socket. The PCBA also may include a thermal cover comprising a thermally conductive material and a thermal strap thermally coupled to the thermal cover. The thermal cover may be thermally coupled to the integrated circuit package and may mechanically urge the integrated circuit package in contact with the socket. The thermal strap may include a thermally conductive material.

In some examples, the disclosure describes a method including assembling an integrated circuit package with a socket, wherein the socket is electrically coupled to a PCB of a PCBA. The method also may include thermally coupling a thermal cover to the integrated circuit package. In accordance with at least some of these examples, the thermal cover may mechanically urge the integrated circuit package in contact with the socket, and a thermal strap thermally may be coupled to the thermal cover, and wherein the thermal strap comprises a thermally conductive material.

The details of one or more examples are set forth in the accompanying drawings and the description below. Other features, objects, and advantages will be apparent from the description and drawings, and from the claims.

DETAILED DESCRIPTION

The disclosure describes a printed circuit board assembly (PCBA) including a thermal management mechanism for removing heat from an integrated circuit (IC) using thermal conduction. In some examples, PCBAs may be used in applications in which convection-based cooling may not be practicable, such as in high vacuum applications, including space. As described herein, IC packages may be cooled using conduction of heat to heat sinks, such as the PCB, a chassis in which the PCBA is housed, or both. The conduction of heat from the IC package may be accomplished using a thermal cover and a thermal strap. The thermal cover may be thermally coupled to the IC package and may mechanically urge the IC package into electrical contact with a socket.

The thermal cover may be in thermal contact with a top surface of the IC package, a bottom surface of the IC package may be configured to electrically contact a complementary socket. For example, the IC package may include a land grid array (LGA) of electrically conductive pads on its bottom surface and the socket may include a complementary array of electrically conductive pins. An LGA may reduce mechanical stress on the electrical connections between the IC package and the socket compared to solder connections used in a ball grid array (BGA) or a column grid array (CGA) electrical connection between the IC package and the PCB. For example, solder connections in BGA or CGA electrical connections may fatigue over time due to differential thermal expansion and contraction between the substrate of the IC package and the PCB when experiencing temperature changes. As another example, in some implementations, the PCBA may be used in environments that experience vibration or other mechanical shocks. The LGA electrical connection may be more resilient under mechanical shock compared to a BGA or CGA electrical connection.

However, an LGA electrical connection between the IC package and the socket may reduce heat transfer from the IC substrate to the socket through the LGA electrical contacts compared to an amount of heat that may be through a BGA or CGA electrical connection. The thermal cover and thermal strap may provide an alternate thermal pathway by which heat may be removed from the IC package. The thermal strap also may be made of relatively compliant material, such as copper film or a thermally conductive composite material, which may facilitate relaxed manufacturing tolerances and relative movement between the PCB and the IC under thermal cycling. In some examples, the thermal cover and thermal strap may also facilitate use of commercial off the shelf components, which may not be hermetic, in applications where a hermetic component has been used. The IC package may be coupled to the PCB after other components have been coupled to the PCB.

Figure 1:
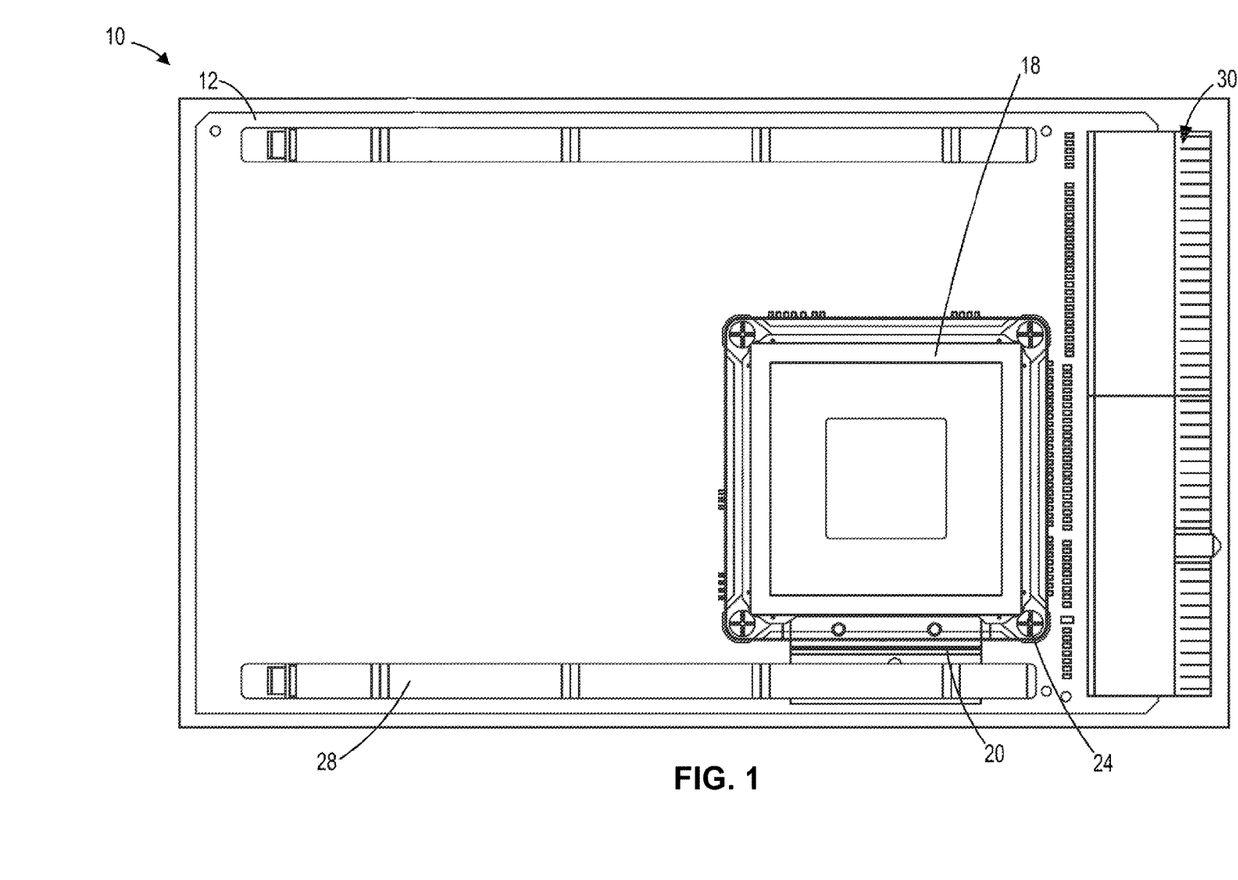
FIG. 1 is a conceptual and schematic diagram illustrating a top view of an example printed circuit board assembly including an integrated circuit package, a thermal cover, and a thermal strap.
Figure 2:
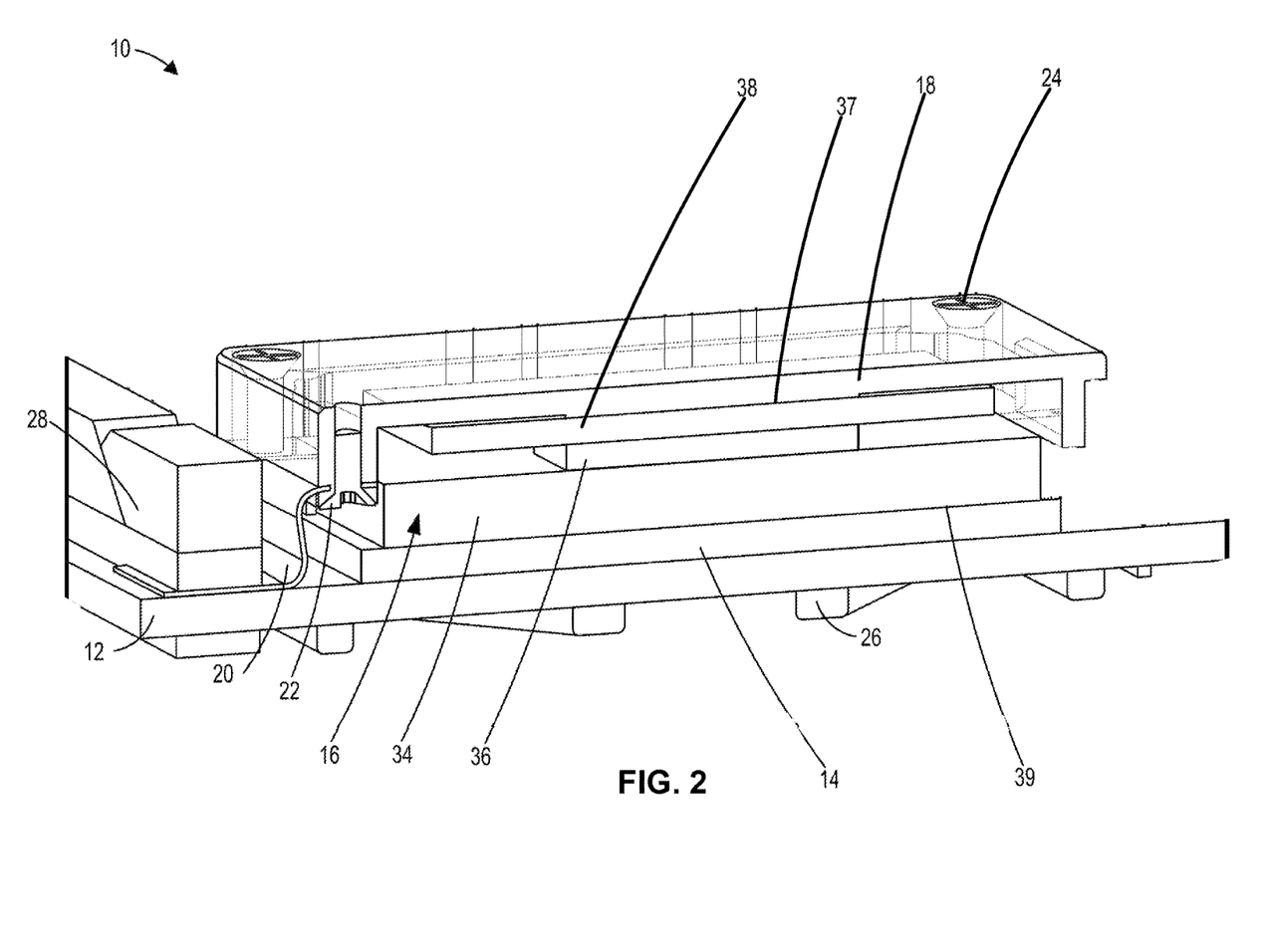
FIG. 2 is a conceptual and schematic diagram illustrating a cross-sectional view of an example printed circuit board assembly including an integrated circuit package, a thermal cover, and a thermal strap.

FIG. 1 is a conceptual and schematic diagram illustrating a top view of PCBA 10 including a PCB 12, a socket 14, an IC package 16, a thermal cover 18, and a thermal strap 20. FIG. 2 is a conceptual and schematic diagram illustrating a cross-sectional view of PCBA 10 including IC package 16, thermal cover 18, and thermal strap 20.

PCB 12 includes a plurality of electrical components attached thereto and electrically connected to electrically conductive traces formed on one or both major surfaces of PCB 12 or in planes or layers within PCB 12. PCB 12 and the electrical traces formed therein, thereon, or both enable electrical connection between components of PCBA, an IC in IC package 16, and electronics external to PCBA 10 via electrical connections in PCBA connector 30.

Figure 3:
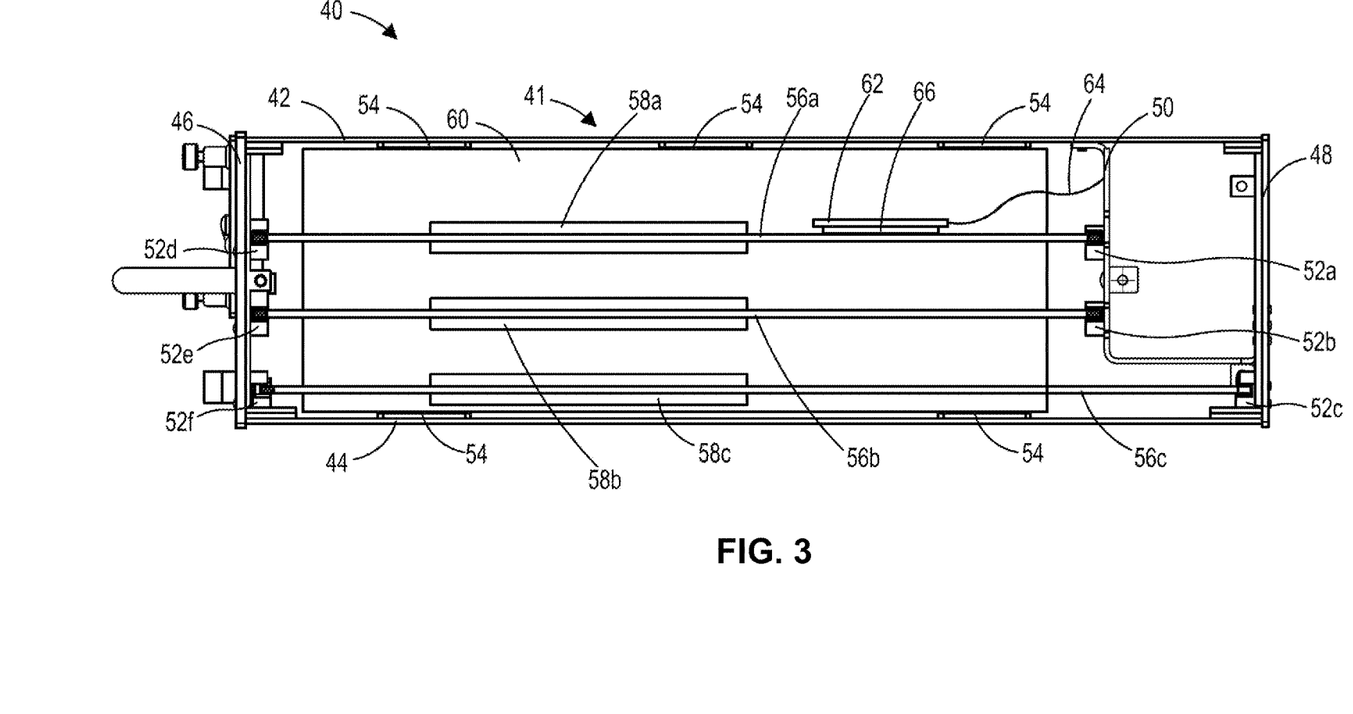
FIG. 3 is a conceptual and schematic diagram illustrating a top view of an exam system including a chassis and a printed circuit board assembly including an integrated circuit package, a thermal cover, and a thermal strap.

PCB 12 is also mechanically coupled to card guide rails 28. Card guide rails 28 may mechanically contact complementary card guide channels of a chassis into which PCBA 10 is inserted. In some examples, card guide rails 28 also may include a mechanism to restrain PCBA 10 relative to the chassis. For example, card guide rails 28 may include a clamping mechanism, such as a wedge lock, which can be engaged after PCBA 10 is inserted into the desired position within the chassis to reduce or substantially eliminate movement of PCBA 10 relative to the chassis. The desired position may include a position at which electrical connectors in PCBA connector 30 are electrically coupled to complementary electrical connectors on a complementary master interconnect board (MIB) or backplane connector. FIG. 3 is a conceptual and schematic diagram that illustrates an example chassis 40, card guide rails 52a-52f (collectively referred to herein as, "card guide rails 52"), and a MIB 60. FIG. 3 is described in additional detail below.

PCBA 10 also includes a socket 14, which is mechanically and electrically coupled to PCB 12. Socket 14 may include a plurality of electrical contacts, each of which is electrically coupled to a respective electrical trace in PCB 12. In some examples, socket 14 is a LGA socket, and includes a plurality of electrically conductive pins arranged in a complementary pattern to a plurality of electrically conductive pads on a substrate of IC package 16. Socket 14 also may define a shape configured to receive IC package 16, e.g., a complementary shape to a substrate of IC package 16. In some examples, socket 14 is a commercially available socket for connecting IC package 16 to PCB 12.

As shown in FIG. 2, IC package 16 may include a substrate 34, an IC 36, and a package cover 38. Substrate 34 forms the mechanical and electrical contact with socket 14, and may include an electrically insulating material in which a plurality of electrically conductive traces comprising electrically conductive material are formed. The electrically conductive traces may provide pathways for signals to be transmitted between PCB 12 and IC 36. In some examples, IC package 16 includes a LGA package, and substrate 34 may define a plurality of electrically conductive pads on bottom surface 39 of substrate 34. The plurality of electrically conductive pads may form an array of pads that is substantially the same layout as the array of electrical contacts of socket 14, such that the arrays are complementary and respective ones of the plurality of electrically conductive pads contact respective ones of the plurality of electrical contacts. In this way, substrate 34 and socket 14 facilitate electrical connection between IC 36 and PCB 12. In other examples, IC package 16 may include a BGA package.

IC 36 may include any type of integrated circuit, including, for example, a processor. Example processors include microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In other examples, IC 36 may include a memory device, such as random access memories (RAM), dynamic random access memories (DRAM), static random access memories (SRAM), flash memory, electrically programmable memory (EPROM), or electrically erasable and programmable (EEPROM) memory.

IC 36 includes a plurality of electrical contacts for electrically connecting to the electrical of substrate 34 to allow signals to be transmitted between substrate 34 and IC 36. In some examples, IC 36 may be flip-chip bonded to substrate, Additionally or alternatively, electrically conductive pads on IC 36 may be electrically connected to electrically conductive pads on substrate 34 using wire bonding.

IC package 16 also may include a package cover 38. In some example, package cover 38 may, together with substrate 34, substantially enclose IC 36 within a volume defined by package cover 38 and substrate 34. In some examples, package cover 38 may be joined to substrate 34 using a technique that forms a hermetic seal between substrate 34 and package cover 38, such as brazing or soldering. In other examples, package cover 38 may not be hermetically joined to substrate 34. In some examples, as shown in FIG. 2, package cover 38 is not attached to substrate 34, and is instead attached only to a top surface of IC 36.

In some examples, package cover 38 includes a thermally conductive material. For example, package cover 38 may include a thermally conductive ceramic, such as AlN, SiC, $Al_2O_3$, or the like. Package cover 38 may be mechanically joined to the top surface of IC 36 using a thermally interface material, such as a thermally conductive solder, paste, or adhesive. In this way, package cover 38 may function as a heat spreader, receiving heat generated by IC 36 during operation of IC 36 and spreading the heat throughout the volume of package cover 38.

In other examples, IC package 16 may include any rigid, substantially planar device that includes at least one semiconductor die. For example, IC package 16 may include a PCB and at least one semiconductor die attached to the PCB, without a package cover 38.

In accordance with one or more examples of this application, PCBA 10 also includes a thermal cover 18. Thermal cover 18 is thermally and mechanically coupled to package cover 38, e.g., to a top surface 37 of package cover 38. Because thermal cover 18 is in thermal contact with top surface 37 of package cover 38, thermal cover 18 may receive via package cover 38 heat generated by IC 36. Thermal cover 18 may be formed of a thermally conductive, relatively stiff material, with a thickness sufficient to provide predetermined stiffness and volume to thermal cover 18. For example, thermal cover 18 may include any one or more of the following materials: aluminum, an aluminum alloy, copper, a copper alloy, a thermally conductive composite, a thermally conductive ceramic, or the like. Example aluminum alloys include an alloy including between about 60 weight percent (wt. %) and about 64 wt. % beryllium, less than about 1 wt. % oxygen, less than about 0.1 wt. % carbon, less than about 0.2 wt. % each of one or more other metal, and a balance aluminum, which is available under the trade designation AlBeMet® from Materion Brush Beryllium & Composites, Elmore, Ohio. As another example, thermal cover 18 may comprise a k-Core® heat transfer system, which includes an encapsulant material encapsulating annealed pyrolytic graphite, and is available from Thermacore, Inc., Lancaster, Pa. The encapsulant material may include aluminum, copper, magnesium, beryllium, an aluminum-beryllium alloy, a copper-molybdenum alloy, a copper-tungsten alloy, an aluminum-silicon alloy, or the like. An example thermally conductive composite may include a carbon fiber composite material.

In some examples, thermal cover 18 also mechanically presses or urges IC package 16 (e.g., substrate 34 of IC package 16) into contact with socket 14. For example, thermal cover 38 may include a plurality of apertures which receive fasteners 24. In some examples, fasteners 24 include screws, and may also include springs to mediate a force applied by the fasteners 24 against thermal cover 18 (and, indirectly, the force applied between IC package 16 and socket 14 by fasteners 24). In some examples, PCBA 10 also may include a mounting bracket 26 on an opposite side of PCB 12 from socket 14. Mounting bracket 26, Which also may be referred to as a PCB stiffener, may be formed from a relatively stiff material, such as stainless steel, another metal or alloy, a plastic, a composite, a ceramic, the like, and may receive fasteners 24. Mounting bracket 26 may be stiffer than PCB 12, and thus may deflect less under the force applied by fasteners 24 when fasteners 24 are tightened to force IC package 16 against socket 14. In this way, mounting bracket 26 may facilitate intimate thermal contact between top surface 37 of package cover 38 and thermal cover 18, as well as help maintain the electrical connections between IC package 16 and socket 14. Together, mounting bracket 26 and thermal cover 18 may stiffen PCBA 10, at least the portion of PCBA 10 proximate to socket 14, compared to a PCBA that does not include thermal cover 18 and mounting bracket 26.

Thermal cover 18 is thermally and mechanically coupled to a thermal strap 20. Thermal strap 20 may be formed of a relatively flexible, thermally conductive material. For example, thermal strap 20 may be formed of aluminum, copper, an aluminum alloy, a copper alloy, a thermally conductive composite, or the like. In some examples, thermal strap 20 may be formed of a copper strip or film (e.g., a copper strip or film with a thickness between about 0.01 inch (about 0.254 millimeters) and about 0.02 inch (about 0.508 millimeters)). In some examples, thermal strap 20 may include a plurality of layers of material, and at least one of the layers of material may include a thermally conductive material.

Thermal strap 20 provides a thermal pathway from thermal cover 18 to another structure of PCBA 10 or another structure adjacent to PCBA. For example, as shown in FIGS. 1 and 2, thermal strap 20 may be thermally coupled to a circuit card assembly (CCA) clamping mechanism 28. CCA clamping mechanism 28 may engage with a card guide (not shown in FIGS. 1 and 2) to guide PCBA 10 into electrical and mechanical coupling with another PCBA, such as a master interconnect board or backplane (MIB; not shown in FIGS. 1 and 2). In some examples, CCA clamping mechanism 28 may include a wedge lock. CCA clamping mechanism 28 then may be manipulated, e.g., by turning a screw, to cause a portion of CCA clamping mechanism 28 to move and restrain PCBA 10 relative to the card guide. At least a portion of CCA clamping mechanism 28 may be formed of a thermally conductive material, such as a metal, alloy, thermally conductive composite material, or thermally conductive ceramic.

As shown in FIG. 2, a first end of thermal strap 20 may be brought into thermal contact with thermal cover 18 using one or more fasteners, such as one or more screws. In other examples, a portion of thermal strap 20 may be restrained in thermal contact with thermal cover 18 using a thermally conductive adhesive, a thermally conductive solder, a thermally conductive braze, or the like. In the example illustrated in FIGS. 1 and 2, a second portion (e.g., end) of thermal strap 20 is coupled to CCA clamping mechanism 28. For example, CCA clamping mechanism may be clamped between CCA clamping mechanism 28 and PCB 12. In other examples, the second portion (e.g., end) of thermal strap 20 may be adhered to, soldered to, or brazed to CCA clamping mechanism 28. In other examples, the second portion (e.g., end) of thermal strap 20 may be adhered to, soldered to, brazed to, or otherwise thermally connected to another thermally conductive structure, such as a heat sink, a chassis in which PCBA 10 is disposed (see, e.g., FIG. 3), another PCB, or the like.

In some examples, instead of a second portion e.g., second end) of thermal strap 20 being coupled to a single structure or at a single location of a single structure, thermal strap 20 may be coupled to multiple structures, multiple locations of a single structure, or both. For example, thermal strap 20 may be partially divided (e.g., forked) to form multiple portions opposite to the first end coupled to thermal cover 18. Each portion of the multiple portions may be thermally coupled to a respective structure, such as PCB 12, CCA clamping mechanism 28, a heat sink, a chassis in which PCBA 10 is disposed (see, e.g., FIG. 3), another PCB, or the like. In some examples, more than one portion of the multiple portions may be thermally coupled to the same structure. For example, thermal strap 20 may be thermally coupled to PCB 12 in at least one location.

Utilizing thermal cover 18 and thermal strap 20 to provide a conductive thermal pathway from IC package 16 to another thermally conductive structure may allow use of an LGA package and socket in applications in which convection cooling of IC 36 is not practicable, such as high vacuum applications. The thermal cover 18 and thermal strap 20 may provide thermal performance comparable to or better than a BGA or CGA package that utilizes the solder connections to the PCB as the primary thermal pathway for removing heat from the IC.

This may allow use of LGA packaged components in space applications without requiring a reworking of the LGA package to a BGA CGA package, Using an LGA package may eliminate soldering of the package to the socket 14 or PCB 12, which may reduce or eliminate exposure of other components of PCBA 10 to the chemicals used in the soldering process. This may facilitate use of components that are not hermetically sealed while reducing a chance of damaging those components. In some examples, using an LGA package also may facilitate replacement of the LGA package compared to a BGA or CGA package. An LGA package also may be installed in the PCBA 10 last, which may allow functional testing and verification of the LGA package prior to installation on PCBA 10, which may facilitate manufacturing of the PCBA 10. In some examples, the LGA package also may reduce or eliminate solder fatigue due to thermal cycling of PCBA 10 during use, as no solder is used to join an LGA package to an LGA socket.

As described above, in some examples, PCBA 10 may be used in as part of a system including other PCBAs, such as a MIB or backplane. FIG. 3 is a conceptual and schematic diagram illustrating a top view of an example system 40 including a chassis 41 and a first PCBA 56a including an integrated circuit package 66, a thermal cover 62, and a thermal strap 64. Chassis 41 may be configured to substantially fully enclose one or more PCBAs, such as PCBAs 56a-56c (collectively referred to herein as, "PCBAs 56") and MIB 60 shown in FIG. 3. In some examples, chassis 41 may separate the one or more PCBAs 56 from the environment external to the chassis 41, e.g., to protect the one or more PCBAs from environmental contaminants, physical damage, and/or electrical interference.

In the example shown in FIG. 3, chassis 41 includes a first sidewall 42 and a second sidewall 44. First and second sidewalk 42, 44 are connected at respective ends by first end wall 46 and second end wall 48. Although not shown in FIG. 3, chassis 41 also include a cover and a base that substantially occupies the space between the edges of sidewalk 42, 44 and end walls 46, 48, such that when fully assembled, chassis 41 forms a substantially closed container that encloses the electronics such as PCBAs 56 and MIB 60 shown in FIG. 3). In some examples, first and second sidewalk 42, 44 and first and second end walls 46, 48 may be formed of a metal or an alloy, such as stainless steel, aluminum, titanium, or the like. In other examples, first and second sidewalls 42, 44 and first and second end walls 46, 48 may be formed of a composite material, such as a carbon fiber composite material. In some examples, first and second sidewalls 42, 44 and first and second end walls 46, 48 may be formed of the same material. In other examples, at least one of first and second sidewalls 42, 44 and first and second end walls 46, 48 may be formed from a different material that at least one other of first and second sidewalk 42, 44 and first and second end sidewalls 46, 48. In some examples, the material from which at least one of first and second sidewalls 42, 44 and first and second end walls 46, 48 is formed may be thermally conductive.

Chassis 41 further includes a bracket 50 on which a first card guide 52a and a second card guide 52b are mounted. In the example illustrated in FIG. 3, bracket 50 is attached to an interior surface of second end wall 48 and an interior surface of first sidewall 42. In other examples, bracket 50 may be attached to other structures of chassis 41, e.g., second sidewall 44 or first end wall 46. Alternatively, in some examples, chassis 41 may not include bracket 50.

In some examples, bracket 50 may be formed of the same material as at least one of first and second sidewalls 42, 44 and/or first and second end walls 46, 48. In other examples, bracket 50 may be formed of a different material than first and second sidewalls 42, 44 and/or first and second end walls 46, 48. As examples, bracket 50 may be formed of any one or more of aluminum, stainless steel, titanium, a composite material, or the like.

As shown in FIG. 3, a third card guide 52c is mounted on the interior surface of second end wall 48. In some examples, instead of being mounted on second end wall 48, third card guide 52c may be mounted on bracket 50 or another structure within chassis 41. Fourth, fifth, and sixth card guides 52d, 52e, and 52f are mounted on an interior surface of first end wall 46.

MIB 60 is disposed adjacent to a bottom wall chassis 41, and may be mounted within chassis 41 on brackets 54, as shown in FIG. 3. MIB 60 may include one or more PCBAs (e.g., each PCBA including a PCB with electronic anchor electrical components surface mounted or through-mounted thereon), and may include a first electrical connector 58a, a second electrical connector 58b, and a third electrical connector 58c (collectively "electrical connectors 58") for electrically connecting to PCBAs 56.

As shown in FIG. 3, fourth card guide 52d may be substantially aligned with first card guide 52a to form a first card guide pair configured to receive first PCBA 56a and substantially retain first PCBA 56a in place relative to MIB 60 (e.g., by engaging with a CCA clamping mechanism 28 of first PCBA 56a). The first card guide pair is substantially aligned with first electrical connector 58a so when first PCBA 56a is properly inserted in first card guide 52a and fourth card guide 52d, an electrical connector of first PCBA 56a is aligned with and can electrically connect to first electrical connector 58a of NUB 60. Similarly, fifth card guide 52e may be substantially aligned with second card guide 52b to form a second card guide pair that is substantially aligned with second electrical connector 58b and is configured to receive a second PCBA 56b and substantially retain second PCB 56b in place relative to MIB 60. Sixth card guide 52f may be substantially aligned with third card guide 52c to form a third card guide pair that is substantially aligned with third electrical connector 58c and is configured to receive a third PCBA 56c and substantially retain third PCBA 56c in place relative to MIB 60.

Although FIG. 3 illustrates a chassis 41 that includes six card guides 52a-52f, in other examples, chassis 41 may include a fewer or greater number of card guides 52. In some examples, at least one of card guides 52 may not be arranged or positioned in a pair with another one of card guides 52, and a single one of card guides 52 may be used to accept a PCBA, e.g., PCBA 56a.

As shown in FIG. 3, first PCBA 56a includes an IC package 66 and a thermal cover 62. IC package 66 and thermal cover 62 may be similar to or substantially the same as IC package 16 and thermal cover 18 of FIGS. 1 and 2, respectively. In contrast to the example illustrated in FIGS. 1 and 2, the example shown in FIG. 3 includes a thermal strap 64 that is thermally coupled to thermal cover 62 and bracket 50 of chassis 41.

Thermal strap 64 may be similar to or substantially the same as thermal strap 20 illustrated in FIGS. 1 and 2. However, instead of a portion of thermal strap 20 being coupled to or attached to a structure of first PCBA 56a, a portion of thermal strap 64 is coupled to bracket 50. As described above, bracket 50 may be formed of a metal, an alloy, or a composite material, and may be thermally conductive. Bracket 50 also is mechanically attached to first sidewall 42 and second end wall 48 of chassis 41. Because of this, bracket 50 may function as an effective heat sink for heat generated by IC package 66. Thermal strap 64 may be thermally coupled to bracket 50 using a thermally conductive adhesive, a clamp, a thermally conductive solder, a thermally conductive braze, or the like.

In some examples, rather than being coupled to bracket 50, thermal strap 64 may be thermally coupled to another component of chassis 41, such as a component of MIB 60 first sidewall 42, second sidewall 44, first end wall 46, or the like. In general, thermal strap 64 may be thermally coupled between thermal cover 62 and another thermally conductive structure, such as a heat sink, another PCB or PCBA, or the like.

Figure 4:
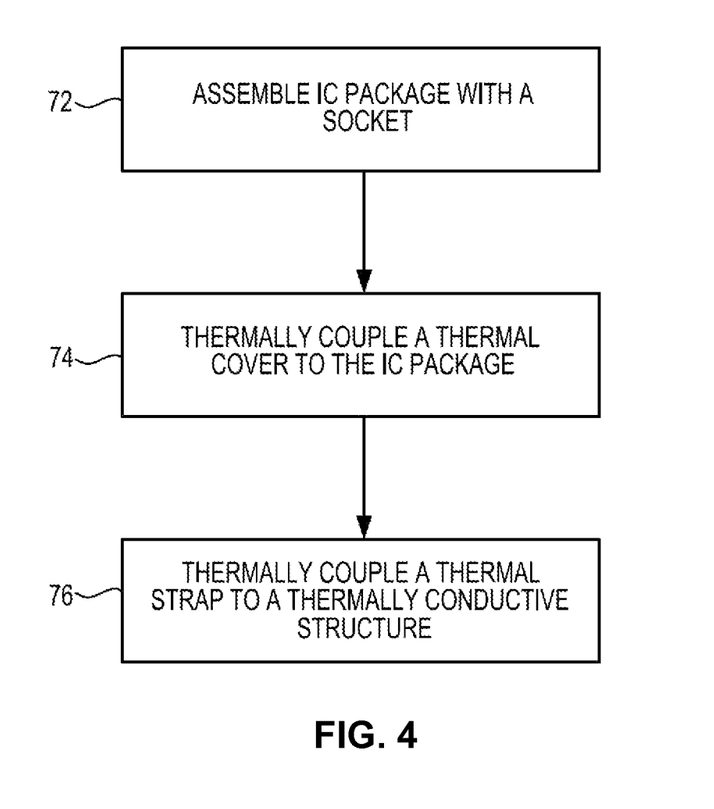
FIG. 4 is a flow diagram illustrating an example technique for forming an example printed circuit board assembly including an integrated circuit package, a thermal cover, and a thermal strap.

FIG. 4 is a flow diagram illustrating an example technique for forming an example PCBA including an IC package, a thermal cover, and a thermal strap. The technique of FIG. 4 will be described with concurrent reference to PCBA 10 illustrated in FIGS. 1 and 2 for purposes of illustration only. However, in other examples, the technique of FIG. 4 may be used to form a different PCBA, a different technique may be used to form PCBA 10, or both.

The technique of FIG. 4 includes assembling IC package 16 with socket 14 (72). Socket 14 is electrically and mechanically coupled to PCB 12 of PCBA 10. Assembling IC package 16 with socket 14 (72) may include substantially aligning electrical contacts of IC package 16 with corresponding electrical contacts of socket 14. For example, IC package 16 may include an LGA package, and may include a plurality of electrically conductive pads. Socket 16 may include an LGA socket, and may include a plurality of electrically conductive pins. Assembling IC package 16 with socket 14 (72) may include substantially aligning respective ones of the plurality of electrically conductive pins with respective ones of the electrically conductive pads, and brining the respective pins and pads into contact.

The technique of FIG. 4 also may include thermally coupling thermal cover 18 to IC package 16 (74). Thermal cover 18 may mechanically urge IC package 16 (e.g., substrate 34 of IC package 16) in contact with socket 14. Further, thermal strap 20 is thermally coupled to thermal cover 18, e.g., using clamping, adhesive, soldering, brazing, or the like. In some examples, the technique may include thermally coupling thermal strap 20 to thermal cover 18. Thermal strap 20 may include a thermally conductive material, such as aluminum, copper, an aluminum alloy, a copper alloy, a thermally conductive composite, or the like.

The technique of FIG. 4 also may optionally include thermally coupling a portion of thermal strap 20 to another thermally conductive structure (76). As described above, the other thermally conductive structure may include a chassis 41 (FIG. 3) in which PCBA 10 is disposed, a CCA clamping mechanism 28, a MIB 60 (FIG. 3), a heat sink, another PCB or PCBA, or the like. In this way, the technique of FIG. 4 may form a thermal pathway between IC package 16 and a thermally conductive structure using thermal cover 18 and thermal strap 20.

Various examples have been described. These and other examples are within the scope of the following claims.

What is claimed is:

1. A system comprising:
a chassis comprising a card guide;
a printed circuit board assembly (PCBA);
a circuit card assembly clamping mechanism mechanically coupled to the PCBA, wherein the circuit card assembly clamping mechanism restrains the PCBA relative to the card guide, and wherein the PCBA comprises:
a printed circuit board (PCB);
a socket mechanically and electrically coupled to the PCB;
an integrated circuit package electrically coupled to the socket;
a thermal cover comprising a thermally conductive material, wherein the thermal cover is thermally coupled to the integrated circuit package and mechanically urges the integrated circuit package in contact with the socket; and
a flexible thermal strap thermally coupled between the thermal cover and the circuit card assembly clamping mechanism, wherein the flexible thermal strap comprises a thermally conductive material.

2. The system of claim 1, wherein the integrated circuit package comprises at least one of a land grid array (LGA) package or a ball grid array (BGA) package, wherein the at least one of the LGA package or the BGA package comprises a substrate, an integrated circuit, and a package cover, and wherein the thermal cover is thermally coupled to the package cover.

3. The system of claim 1, wherein the thermal cover comprises at least one of a copper alloy, an aluminum alloy, a thermally conductive composite material, or a thermally conductive ceramic material.

4. The system of claim 1, wherein the flexible thermal strap comprises at least one of copper, a copper alloy, or a thermally conductive composite material.

5. The system of claim 1, wherein the flexible thermal strap is further mechanically and thermally coupled to at least one of a heat sink or the chassis.

6. The system of claim 1, wherein the socket is mechanically and electrically coupled to a first side of the PCB, further comprising a mounting bracket on a second, opposite side of the PCB, wherein the thermal cover is mechanically coupled to the mounting bracket and urges the integrated circuit package in contact with the socket.

7. A method comprising:
assembling an integrated circuit package with a socket, wherein the socket is electrically coupled to a printed circuit board (PCB) of a printed circuit board assembly (PCBA); and
thermally coupling a thermal cover to the integrated circuit package, wherein the thermal cover mechanically urges the integrated circuit package in contact with the socket; and
thermally coupling a thermal strap between the thermal cover and a circuit card assembly clamping mechanism that is mechanically coupled to the PCBA wherein the flexible thermal strap comprises a thermally conductive material,
restraining the printed circuit board assembly relative to a card guide with the circuit card assembly clamping mechanism, wherein a chassis includes the card guide.

8. The method of claim 7, further comprising:
thermally coupling the flexible thermal strap to the PCB.

9. The method of claim 8, wherein thermally coupling the flexible thermal strap to the PCB comprises clamping a portion of the flexible thermal strap between the circuit card assembly clamping mechanism and the PCB.

10. The method of claim 7, further comprising:
mechanically and thermally coupling the flexible thermal strap to the chassis.

11. The method of claim 7, wherein the integrated circuit package comprises at least one of a land grid array (LGA) package or a ball grid array (BGA) package, wherein the at least one of the LGA package or the BGA package comprises a substrate, an integrated circuit, and a package cover, and wherein thermally coupling the thermal cover to the integrated circuit package comprises thermally coupling the thermal cover to the package cover.

12. The PCBA of claim 7, wherein the thermal cover comprises at least one of a copper alloy, an aluminum alloy, a thermally conductive composite material, or a thermally conductive ceramic, and wherein the flexible thermal strap comprises at least one of copper, a copper alloy, or a thermally conductive composite material.

* * * * *